US008988110B2

(12) United States Patent
Nagae

(10) Patent No.: US 8,988,110 B2
(45) Date of Patent: Mar. 24, 2015

(54) NOISE REMOVAL CIRCUIT

(75) Inventor: Yoshihiro Nagae, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 190 days.

(21) Appl. No.: 13/173,774

(22) Filed: Jun. 30, 2011

(65) Prior Publication Data

US 2012/0013397 A1 Jan. 19, 2012

(30) Foreign Application Priority Data

Jul. 13, 2010 (JP) ................. 2010-158706

(51) Int. Cl.
*H03K 5/1252* (2006.01)
*H03M 9/00* (2006.01)

(52) U.S. Cl.
CPC ............... *H03M 9/00* (2013.01); *H03K 5/1252* (2013.01)
USPC ........................................... 327/34; 327/551

(58) Field of Classification Search
CPC .................................................. H03K 5/1252
USPC .......................................... 327/34, 551–559
See application file for complete search history.

(56) References Cited

U.S. PATENT DOCUMENTS

| 7,795,921 | B2 * | 9/2010 | Tanaka | ............................. 326/94 |
| 8,174,290 | B2 * | 5/2012 | Higuchi | ........................... 327/34 |

FOREIGN PATENT DOCUMENTS

| JP | S5246749 | A |  | 4/1977 |  |
| JP | S60127850 | A |  | 7/1985 |  |
| JP | S6216615 | A |  | 1/1987 |  |
| JP | S62254513 | A |  | 11/1987 |  |
| JP | S63107255 | A |  | 5/1988 |  |
| JP | H01125015 | A |  | 5/1989 |  |
| JP | 2001223567 | A | * | 8/2001 | ........... H03K 5/1252 |
| JP | 2002076275 | A |  | 3/2002 |  |

OTHER PUBLICATIONS

Office Action dated Nov. 12, 2013, received in corresponding Japanese application No. 2010-158706 with English Translation, 5 pages.

* cited by examiner

*Primary Examiner* — Patrick O'Neill

(57) ABSTRACT

A noise removal circuit is provided having a first holding circuit (20) and a second holding circuit (22) which holds a value of an input signal (IN) at a plurality of different timings in synchronization with rising and falling of an internal clock signal (ICL) generated within a semiconductor device, and which removes noise of the input signal (IN) according to the held value.

11 Claims, 5 Drawing Sheets

NOISE REMOVAL CIRCUIT

CROSS-REFERENCE TO RELATED APPLICATIONS

The entire disclosure of Japanese Patent Application No. 2010-158706 filed on Jul. 13, 2010, including specification, claims, drawings, and abstract, is incorporated herein by reference in its entirety.

BACKGROUND

1. Technical Field

The present invention relates to a semiconductor device having a noise removal circuit for a control clock.

2. Background Art

Semiconductor devices (LSIs) for controlling predetermined electronic devices are widely in use. As shown in FIG. 5, such a controlling semiconductor device receives a control signal such as an external clock signal CL, a chip select signal CE, or the like from an external controlling computer, and communicates data through a data input line DI and a data output line DO. A controlling system for such a semiconductor device (LSI) is applied, for example, to an optical disk replaying LSI to be equipped on a vehicle or the like.

For example, in a communication data receiving circuit as shown in FIG. 6, the external clock signal CL is high while data A0~A7 are time-sequentially input to the data input line DI as shown in a timing chart of FIG. 7, so that the data A0~A7 are sequentially held in the stages of flip flops included in a shift circuit 10, and in this state, the chip select signal CE falls so that the data A0~A7 are read to the flip flops included in a serial-to-parallel (SP) conversion circuit 12, converted from serial to parallel, and received. Similarly, the communication data transmitting circuit is controlled by the control signal such as the external clock signal CL and the chip select signal CE.

The controlling computer is directly connected to the controlling semiconductor device, and when noise is superposed on the control signal such as the external clock signal CL and the chip select signal CE, there is a possibility that an error will occur in the data communication.

Here, as shown in FIG. 8, a noise removal circuit which uses a high-speed internal clock signal ICL generated inside the controlling semiconductor device is incorporated in the controlling semiconductor device, to apply a process to remove the noise from the control signal or the like. The noise removal circuit comprises a shift circuit 14 in which a plurality of stages of flip flops are connected, a majority determining circuit 16, and an output holding circuit 18. The control signals such as the external clock signal CL and the chip select signal CE are input to the shift circuit 14 as input signals, and the shift circuit 14 holds the input signals while shifting the input signals according to the timing of rising of the internal clock signal ICL. Shift signals S1~S4 which are output from the flip flops of later stages of the shift circuit 14 are input to the majority determining circuit 16. The majority determining circuit 16 finds the majority of either the high level or the low level signal among the shift signals S1~S4, and outputs the signal level of the signal with a higher occurrence. When the numbers of the high level and the low level are equal to each other, a feedback signal FB from the output holding circuit 18 is output without any processing. The output holding circuit 18 holds and outputs an output signal from the majority determining circuit 16 in synchronization with the internal clock signal ICL.

With such a process, influence of noise superposed on the control signal such as the external clock signal CL and the chip select signal CE is reduced.

When the noise removal process is executed using the majority determining circuit 16, the internal clock signal ICL has a frequency which is approximately 20 times that of the control signal such as the external clock signal CL and the chip select signal CE. In the noise removal circuit of FIG. 8, because the output is determined through the majority process according to the result of latching the input signal with 4 stages of flip flops, the internal clock signal ICL must have a frequency of at least 4 times that of the input signal. For example, while the external clock signal CL has a frequency of approximately 2.5 MHz, the internal clock signal ICL has a frequency of approximately 60 MHz.

However, when the frequency of the internal clock signal ICL of the controlling semiconductor device is low, if the number of latch stages is high in the noise removal circuit, the output of the noise removal circuit cannot follow the change (frequency) of the control signal such as the external clock signal CL and the chip select signal CE. On the other hand, if the number of latch stages in the noise removal circuit is reduced, the number of input signals for the majority process is reduced, and the precision of noise removal is also reduced.

SUMMARY

According to one aspect of the present invention, there is provided a semiconductor device comprising a circuit which receives a control clock signal from outside and executes an internal process according to the control clock signal, and a noise removal circuit which holds a value of the control clock signal at a plurality of different timings in synchronization with timings of rise and fall of an internal clock signal generated within the semiconductor device, and which removes noise of the control clock signal according to the held value.

BRIEF DESCRIPTION OF THE DRAWINGS

A preferred embodiment of the present invention will be described in further detail based on the following drawings, wherein.

DESCRIPTION OF EMBODIMENT

Structure

Figure 1:
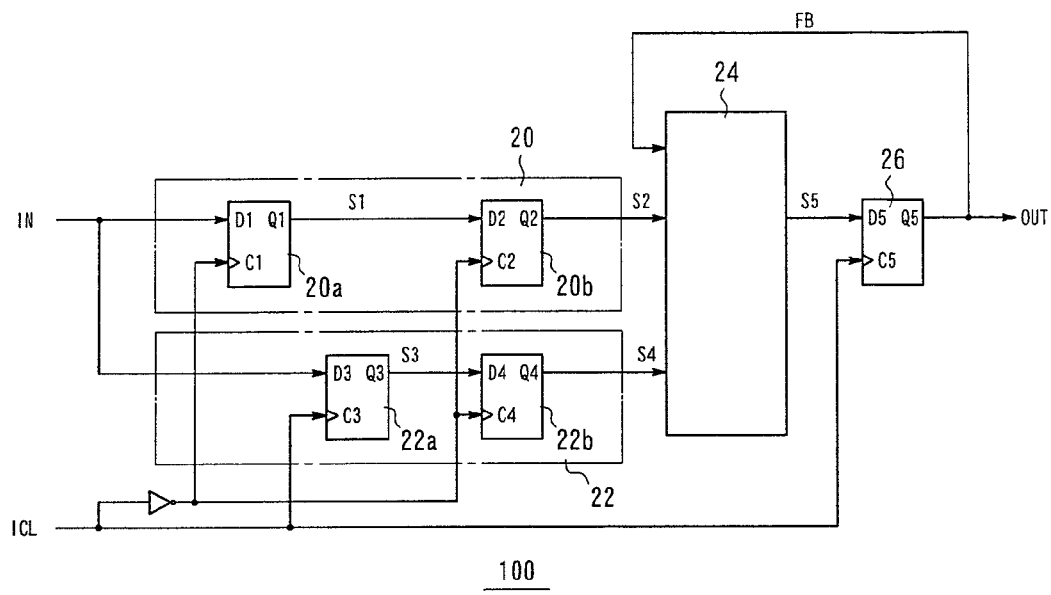
FIG. 1 is a diagram showing a structure of a controlling semiconductor device according to a preferred embodiment of the present invention.

A controlling semiconductor device according to a preferred embodiment of the present invention comprises an improved noise removal circuit 100. As shown in FIG. 1, the noise removal circuit 100 comprises a first holding circuit 20, a second holding circuit 22, a majority determining circuit 24, and an output holding circuit 26.

The first holding circuit 20 comprises a series connection of flip flops 20a and 20b. The control signal such as the external clock signal CL and the chip select signal CE is input from the outside of the controlling semiconductor device to an input terminal D1 of the flip flop 20a. An output terminal Q1 of the flip flop 20a of the first stage is connected to an input terminal D2 of the flip flop 20b of a second stage. In addition, an inverted signal of the internal clock signal ICL of the controlling semiconductor device is input to a clock terminal C1 of the flip flop 20a and a clock terminal C2 of the flip flop 20b.

The first holding circuit 20 functions in the following manner. The flip flop 20a holds a level of an input signal IN which is input to the input terminal D1, at a timing when the internal clock signal ICL changes from the high level to the low level, and then outputs the held level as an output signal S1 from the output terminal Q1. The flip flop 20b holds a level of the output terminal Q1 of the flip flop 20a which is input to the input terminal D2, at a timing when the internal clock signal ICL changes from the high level to the low level, and then outputs the held level as an output signal S2 from an output terminal Q2.

The second holding circuit 22 comprises a series connection of flip flops 22a and 22b. The control signal such as the external clock signal CL and the chip select signal CE is input from the outside of the controlling semiconductor device to an input terminal D3 of the flip flop 22a. An output terminal Q3 of the flip flop 22a of the first stage is connected to an input terminal D4 of the flip flop 22b of the second stage. In addition, the internal clock signal ICL of the controlling semiconductor device is input to a clock terminal C3 of the flip flop 22a and an inverted signal of the internal clock signal ICL of the controlling semiconductor device is input to a clock terminal C4 of the flip flop 22b.

The second holding circuit 22 functions in the following manner. The flip flop 22a holds a level of an input signal IN which is input to the input terminal D3, at a timing when the internal clock signal ICL changes from the low level to the high level, and then outputs the held level as an output signal S3 from the output terminal Q3. The flip flop 22b holds a level of the output terminal Q3 of the flip flop 22a which is input to the input terminal D4, at a timing when the internal clock signal ICL changes from the high level to the low level, and then outputs the held level as an output signal S4 from the output terminal Q4.

As described, between the first holding circuit 20 and the second holding circuit 22, the timings for holding the signals in the flip flops 20a and 22a of the first stage differ from each other by a half period of the internal clock signal ICL. Specifically, the flip flop 20a of the first holding circuit 20 holds the input signal IN at a timing of the fall of the internal clock signal ICL and the flip flop 22a of the second holding circuit 22 holds the input signal IN at a timing of the rise of the internal clock signal ICL.

The majority determining circuit 24 receives the output signals S2 and S4 from the first holding circuit 20 and the second holding circuit 22, and determines an output signal S5 by a majority process according to a combination of the levels of the output signals S2 and S4. Specifically, when both of the output signals S2 and S4 are at the low level, an output signal S5 is set to the low level, and when both of the output signals S2 and S4 are at the high level, the output signal S5 is set to the high level. In addition, when one of the output signals S2 and S4 is at the low level and the other one of the output signals S2 and S4 is at the high level, a level of an output signal OUT which is fed back and input from the output holding circuit 26 is output as the output signal S5.

The output holding circuit 26 comprises a flip flop. The output signal S5 from the majority determining circuit 24 is input to an input terminal D5 of the flip flop. In addition, the internal clock signal ICL of the controlling semiconductor device is input to a clock terminal C5 of the flip flop.

The flip flop holds the level of the output signal S5 which is input to the input terminal D5, at a timing when the internal clock signal ICL changes from the low level to the high level, and then outputs the held level as the output signal OUT from an output terminal Q5.

<Operation of Controlling Semiconductor Device>

Figure 2:
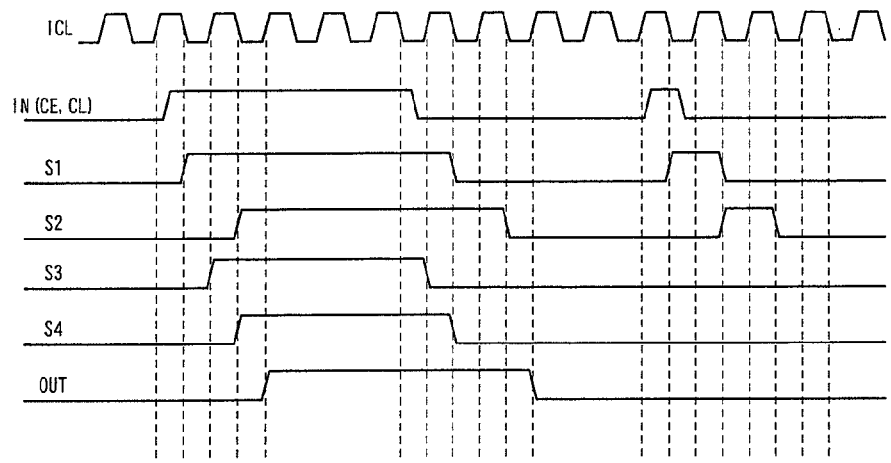
FIG. 2 is a timing chart showing an operation of a noise removal circuit according to a preferred embodiment of the present invention.

An operation of the controlling semiconductor device in the present embodiment will now be described with reference to FIG. 2.

First, a case will be described in which the control signal such as the external clock signal CL and the chip select signal CE which is input as the input signal IN changes from the low level to the high level at a timing when the internal clock signal ICL is at the high level. When the input signal IN changes from the low level to the high level and is maintained at this state, the output signal S1 of the flip flop 20a changes from the low level to the high level in synchronization with the internal clock signal ICL changing from the high level to the low level for the first time, and the output signal S3 of the flip flop 22a changes from the low level to the high level in synchronization with the internal clock signal ICL changing from the low level to the high level for the first time. Then, the output signals S2 and S4 of the flip flops 20b and 22b change from the low level to the high level in synchronization with the internal clock signal ICL next changin from the high level to the low level.

In this state, because both of the output signals S2 and S4 become the high level, the output of the majority determining circuit 24 changes from the low level to the high level, and the output signal OUT of the flip flop of the output holding circuit 26 changes from the low level to the high level in synchronization with the internal clock signal ICL next changing from the low level to the high level.

A case when the control signal such as the external clock signal CL and the chip select signal CE which is input as the input signal IN changes from the high level to the low level at a timing when the internal clock signal ICL is at the high level is similar. Specifically, the output signal S1 of the flip flop 20a changes from the high level to the low level in synchronization with the internal clock signal ICL changing from the high level to the low level for the first time, and the output signal S3 of the flip flop 22a changes from the high level to the low level in synchronization with the internal clock signal ICL changing from the low level to the high level for the first time. The output signals S2 and S4 of the flip flops 20b and 22b change from the high level to the low level in synchronization with the internal clock signal ICL next changing from the high level to the low level.

In this state, because both of the output signals S2 and S4 become the low level, the output of the majority determining circuit 24 changes from the high level to the low level, and the output signal OUT of the flip flop of the output holding circuit 26 changes from the high level to the low level in synchronization with the internal clock signal ICL next changing from the low level to the high level.

When the input signal IN changes at a timing when the internal clock signal ICL is at the high level as described above, if the change is maintained for at least a period of two clocks of the internal clock signal ICL, the output signal OUT is changed according to the level change of the input signal IN.

Next, a case will be described in which the control signal such as the external clock signal CL and the chip select signal CE which is input as the input signal IN changes from the high level to the low level at a timing when the internal clock signal ICL is at the low level. When the input signal IN changes from the high level to the low level and is maintained at this state, the output signal S3 of the flip flop 22a changes from the high level to the low level in synchronization with the internal clock signal ICL changing from the low level to the high level for the first time, and the output signal S1 of the flip flop 20a changes from the high level to the low level and the output signal S4 of the flip flop 22b changes from the high level to the low level in synchronization with the internal clock signal ICL changing from the low level to the high level for the first time. The output signal S2 of the flip flop 20b changes from the high level to the low level in synchronization with the internal clock signal ICL next changing from the high level to the low level.

In this state, because both of the output signals S2 and S4 become the low level, the output of the majority determining circuit 24 changes from the high level to the low level, and the output signal OUT of the flip flop of the output holding circuit 26 changes from the high level to the low level in synchronization with the internal clock signal ICL next changing from the low level to the high level.

A case when the control signal such as the external clock signal CL and the chip select signal CE which is input as the input signals IN changes from the low level to the high level at a timing when the internal clock signal ICL is at the low level is similar. Specifically, the output signal S3 of the flip flop 22a changes from the low level to the high level in synchronization with the internal clock signal ICL changing from the low level to the high level for the first time, and the output signal S1 of the flip flop 20a changes from the low level to the high level and the output signal S4 of the flip flop 22b changes from the low level to the high level in synchronization with the internal clock signal ICL changing from the low level to the high level for the first time. The output signal S2 of the flip flop 20b changes from the low level to the high level in synchronization with the internal clock signal ICL next changing from the high level to the low level.

In this state, because both of the output signals S2 and S4 become the high level, the output of the majority determining circuit 24 changes from the low level to the high level, and the output signal OUT of the flip flop of the output holding circuit 26 changes from the low level to the high level in synchronization with the internal clock signal ICL next changing from the low level to the high level.

When the input signal IN changes at the timing when the internal clock signal ICL is at the low level as described above, if the change is maintained for at least a period of 2.5 clocks of the internal clock signal ICL, the output signal OUT is changed according to the level change of the input signal IN.

On the other hand, when noise is superposed on the input signal IN, if the noise has a pulse width which is shorter than a period of 0.5 clocks of the internal clock signal ICL, the change of the input signal IN is prevented from being transmitted to the majority determining circuit 24 by the transmission delay time of one of the first holding circuit 20 and the second holding circuit 22, and the level of the output signal OUT of the output holding circuit 26 is maintained. In addition, if the noise has a pulse width which is shorter than a period of one clock of the internal clock signal ICL, there may be cases where the change of the input signal IN is prevented from being transmitted to the majority determining circuit 24 by the transmission delay time of one of the first holding circuit 20 and the second holding circuit 22. In such a case, the level of the output signal OUT of the output holding circuit 26 is maintained. In this manner, the noise of a short pulse superposed on the input signal IN can be removed. In addition, reliability with regard to noise can be improved even when the chips are directly connected on a substrate, without an extra process such as providing an external component such as a resistor on a line or the like for which noise or the like is of concern. Thus, the number of components on the substrate can be reduced, and the manufacturing cost for the overall device can be reduced.

<Alternative Configuration>

Figure 3:
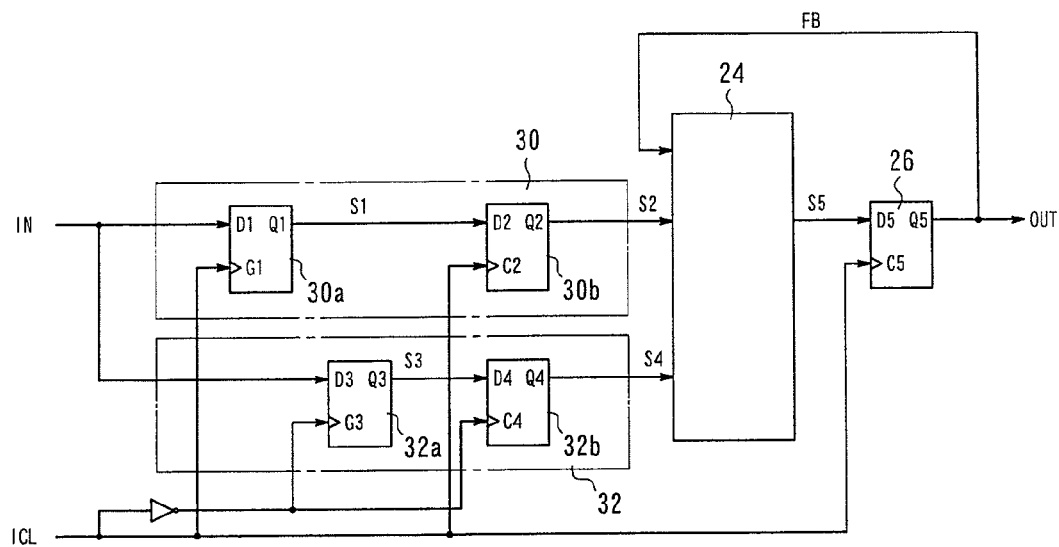
FIG. 3 is a diagram showing a structure of an alternative configuration of the controlling semiconductor device according to the preferred embodiment of the present invention.

In the above-described embodiment, only the flip flops are used in the first holding circuit 20 and the second holding circuit 22. Alternatively, as shown in FIG. 3, similar functions can be realized with a first holding circuit 30 and a second holding circuit 32 using latch elements.

The first holding circuit 30 comprises a series connection of a latch element 30a and a flip flop 30b. A control signal such as the external clock signal CL and the chip select signal CE which is input from the outside of the controlling semiconductor device is input to an input terminal D1 of the latch element 30a. An output terminal Q1 of the latch element 30a of the first stage is connected to an input terminal D2 of the flip flop 30b of the second stage. In addition, the internal clock signal ICL of the controlling semiconductor device is input to a gate terminal G1 of the latch element 30a and a clock terminal C2 of the flip flop 30b.

The first holding circuit 30 functions in the following manner. The latch element 30a latches the input signal IN which is input to the input terminal D1, when the internal clock signal ICL is at the high level, and outputs as an output signal S1. The flip flop 30b holds the level of the output terminal Q1 of the latch element 30a which is input to the input terminal D2, at a timing when the internal clock signal ICL changes from the low level to the high level, and then outputs the held level as an output signal S2 from an output terminal Q2.

The second holding circuit 32 comprises a series connection of a latch element 32a and a flip flop 32b. The control signal such as the external clock signal CL and the chip select signal CE is input from the outside of the controlling semiconductor device to an input terminal D3 of the latch element 32a. An output terminal Q3 of the latch element 32a of the first stage is connected to an input terminal D4 of the flip flop 32b of the second stage. In addition, an inverted signal of the internal clock signal ICL of the controlling semiconductor device is input to a gate terminal G3 of the latch element 32a and a clock terminal C4 of the flip flop 32b.

The second holding circuit 32 functions in the following manner. The latch element 32a latches the input signal IN which is input to an input terminal D3, when the internal clock signal ICL is at the low level, and outputs as an output signal S3. The flip flop 32b holds a level of the output terminal Q3 of the latch element 32a which is input to an input terminal D4, at a timing when the internal clock signal ICL changes from the high level to the low level, and then, outputs the held level as an output signal S4 from an output terminal Q4.

As described, between the first holding circuit 30 and the second holding circuit 32, the timings for holding the signals at the latch elements 30a and 32a of the first stage differ from each other by a half period of the internal clock signal ICL. Specifically, the latch element 30a of the first holding circuit 30 holds the input signal IN at the time of rising of the internal clock signal ICL, and the latch element 32a of the second holding circuit 32 holds the input signal IN at the time of falling of the internal clock signal ICL.

<Operation of Alternative Configuration>

Figure 4:
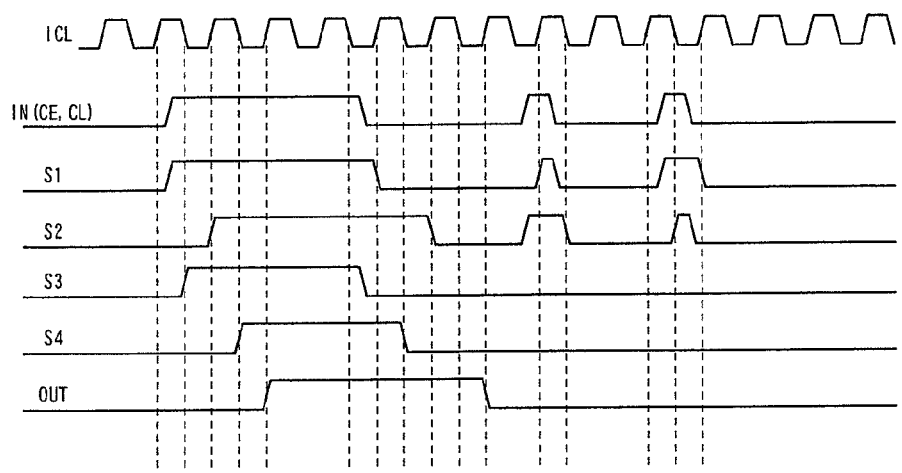
FIG. 4 is a timing chart showing an operation of an alternative configuration of the noise removal circuit according to the preferred embodiment of the present invention.
Figure 5:
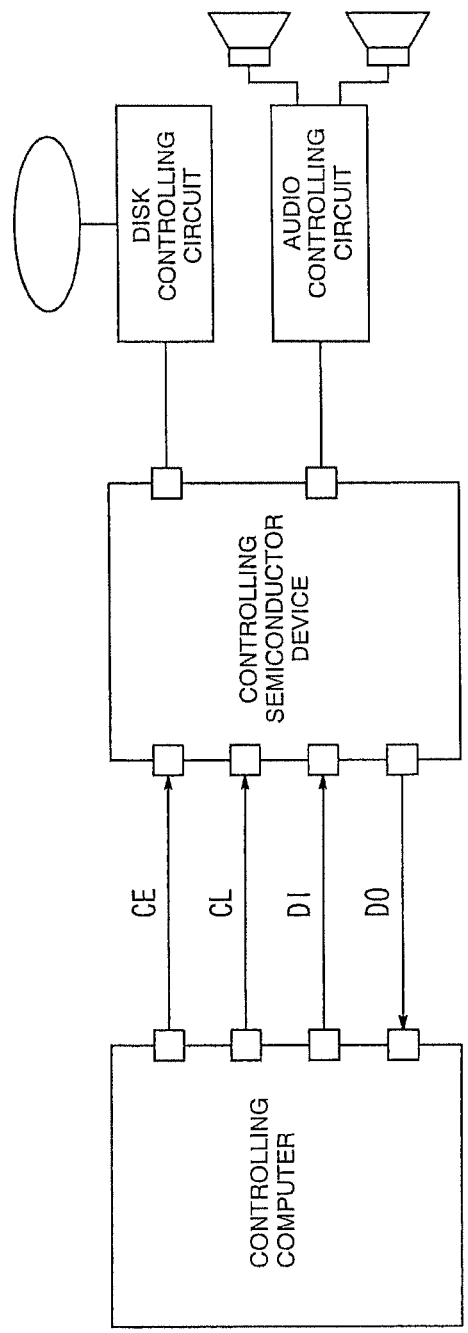
FIG. 5 is a structural diagram of a controlling system showing an example usage of a controlling semiconductor device.
Figure 6:
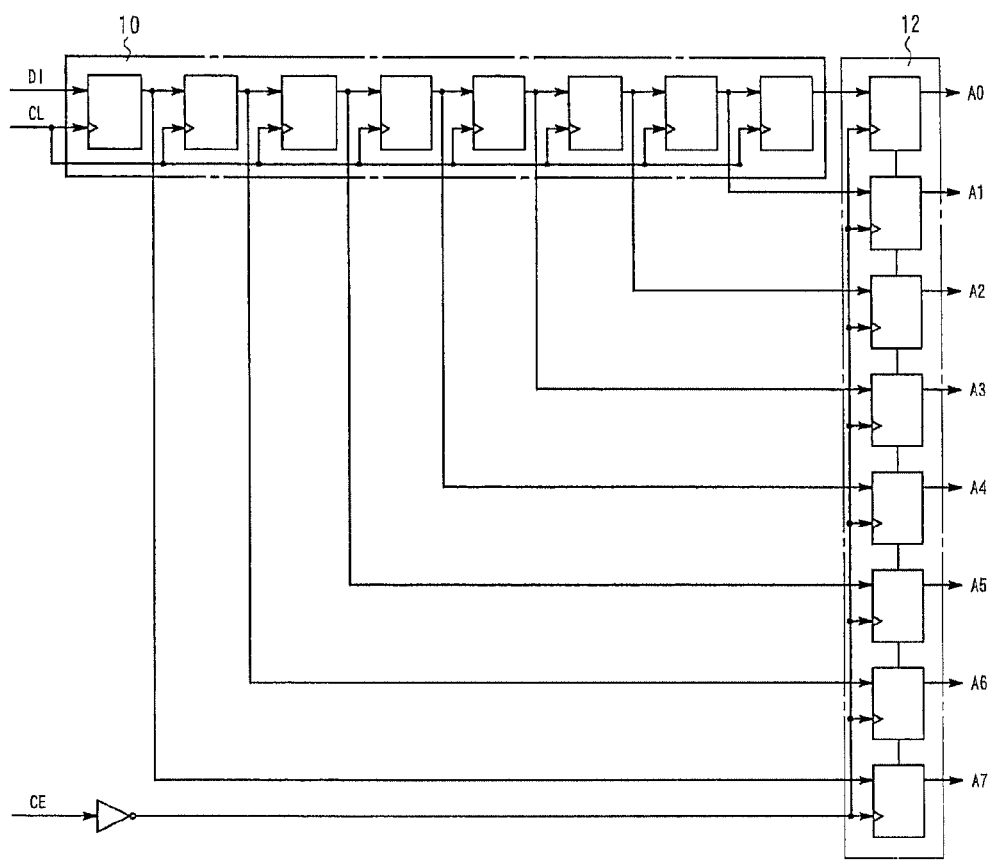
FIG. 6 is a diagram showing a structure of a communication data receiving circuit in related art.
Figure 7:
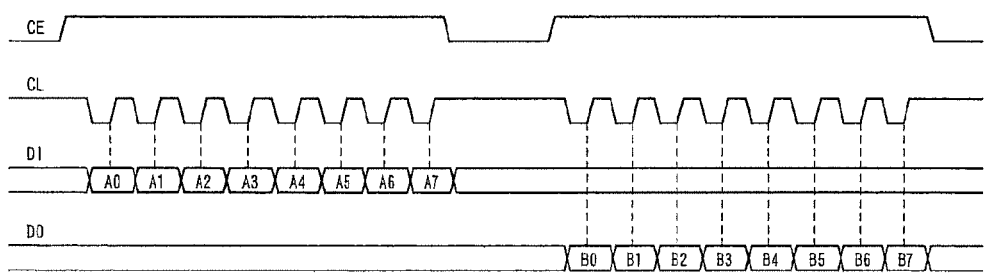
FIG. 7 is a timing chart showing an operation of a communication data receiving circuit in related art.
Figure 8:
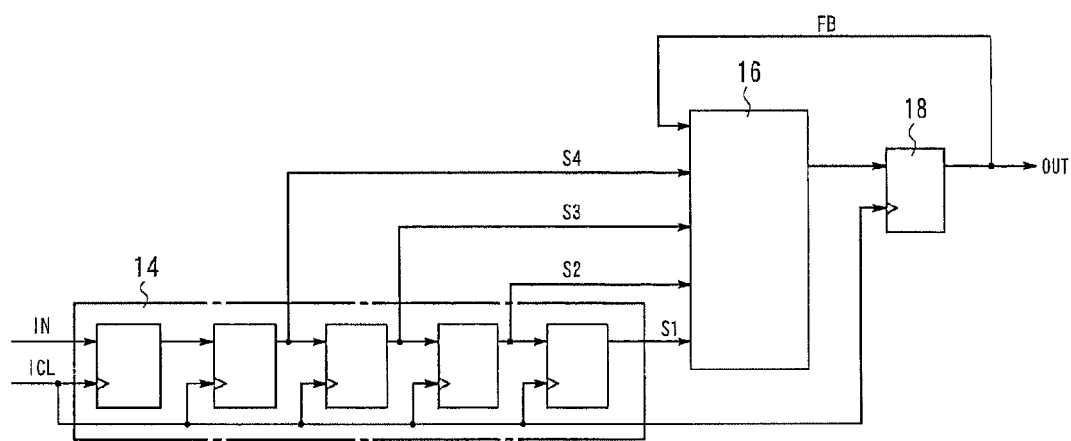
FIG. 8 is a diagram showing a structure of a controlling semiconductor device in related art.

An operation of the controlling semiconductor device in the alternative configuration will now be described with reference to FIG. 4.

First, a case will be described in which the control signal such as the external clock signal CL and the chip select signal CE which is input as the input signal IN changes from the low level to the high level, at a timing when the internal clock signal ICL is at the high level. When the input signal IN changes from the low level to the high level and is maintained at this state, because the internal clock signal ICL is at the high level, the output signal S1 of the latch element 30a changes from the low level to the high level, and then the output signal S3 of the latch element 32a changes from the low level to the high level in synchronization with the internal clock signal ICL changing from the high level to the low level for the first time. Then, the output signal S2 of the flip flop 30b changes from the low level to the high level in synchronization with the internal clock signal ICL next changing from the low level to the high level, and the output signal S4 of the flip flop 32b changes from the low level to the high level in synchronization with the internal clock signal ICL next changing from the high level to the low level.

In this state, because both of the output signals S2 and S4 become the high level, the output of the majority determining circuit 24 changes from the low level to the high level, and the output signal OUT of the flip flop of the output holding circuit 26 changes from the low level to the high level in synchronization with the internal clock signal ICL next changing from the low level to the high level.

A case when the control signal such as the external clock signal CL and the chip select signal CE which is input as the input signal IN changes from the high level to the low level, at a timing when the internal clock signal ICL is at the high level, is similar. Specifically, because the internal clock signal ICL is at the high level, the output signal S1 of the latch element 30a changes from the high level to the low level, and then the output signal S3 of the latch element 32a changes from the high level to the low level in synchronization with the internal clock signal ICL changing from the high level to the low level for the first time. The output signal S2 of the flip flop 30b changes from the high level to the low level in synchronization with the internal clock signal ICL next changing from the low level to the high level, and the output signal S4 of the flip flop 32b changes from the high level to the low level in synchronization with the internal clock signal ICL next changing from the high level to the low level.

In this state, because both of the output signals S2 and S4 become the low level, the output of the majority determining circuit 24 changes from the high level to the low level, and the output signal OUT of the flip flop of the output holding circuit 26 changes from the high level to the low level in synchronization with the internal clock signal ICL next changing from the low level to the high level.

Next, a case will be described in which the control signal such as the external clock signal CL and the chip select signal CE which is input as the input signal IN changes from the high level to the low level, at the timing when the internal clock signal ICL is at the low level. When the input signal IN changes from the high level to the low level and is maintained at this state, because the internal clock signal ICL is at the low level, the output signal S3 of the latch element 32a changes from the high level to the low level, and then, the output signal S1 of the latch element 30a changes from the high level to the low level in synchronization with the internal clock signal ICL changing from the low level to the high level for the first time. The output signal S4 of the flip flop 32b changes from the high level to the low level in synchronization with the internal clock signal ICL next changing from the high level to the low level, and the output signal S2 of the flip flop 30b changes from the high level to the low level in synchronization with the internal clock signal ICL next changing from the low level to the high level.

In this state, because both of the output signals S2 and S4 become the low level, the output of the majority determining circuit 24 changes from the high level to the low level, and the output signal OUT of the flip flop of the output holding circuit 26 changes from the high level to the low level in synchronization with the internal clock signal ICL next changing from the low level to the high level.

A case in which the control signal such as the external clock signal CL and the chip select signal CE which is input as the input signal IN changes from the low level to the high level at the timing when the internal clock signal ICL is at the low level is similar. Specifically, because the internal clock signal IC1 is at the low level, the output signal S3 of the latch element 32a changes from the low level to the high level, and then the output signal S1 of the latch element 30a changes from the low level to the high level in synchronization with the internal clock signal ICL changing from the low level to the high level for the first time. The output signal S4 of the flip flop 32b changes from the low level to the high level in synchronization with the internal clock signal ICL next changing from the high level to the low level, and the output signal S2 of the flip flop 30b changes from the low level to the high level in synchronization with the internal clock signal ICL next changing from the low level to the high level.

In this state, because both of the output signals S2 and S4 become the high level, the output of the majority determining circuit 24 changes from the low level to the high level, and the output signal OUT of the flip flop of the output holding circuit 26 changes from the low level to the high level in synchronization with the internal clock signal ICL next changing from the low level to the high level.

On the other hand, when noise is superposed on the input signal IN, if the noise has a pulse width which is shorter than a period of 0.5 clocks of the internal clock signal ICL, the change of the input signal IN is prevented from being transmitted to the majority determining circuit 24 by the transmission delay time of one of the first holding circuit 30 and the second holding circuit 32, and the level of the output signal OUT of the output holding circuit 26 is maintained. On the other hand, if the noise has a pulse width which is shorter than a period of one clock of the internal clock signal ICL, there may be cases where the change of the input signal IN is prevented from being transmitted to the majority determining circuit 24 by the transmission delay time of one of the first holding circuit 30 and the second holding circuit 32, and in such a case, the level of the output signal OUT of the output holding circuit 26 is maintained. In this manner, the noise of a short pulse superposed to the input signal IN can be removed.

The controlling semiconductor device in the embodiment and the alternative configuration has the following characteristics.

(1) Noise having a pulse width of less than a period of 0.5 clocks of the internal clock signal ICL can be completely removed, and noise having a pulse width of less than the period of one clock of the internal clock signal ICL can be partially removed.

(2) A change in a signal having a pulse width of greater than or equal to the period of one clock of the internal clock signal ICL is output as the output signal OUT.

(3) The delay time of the circuit is 2.5 clocks~3 clocks of the internal clock signal ICL, and if the period of one clock of the control signal such as the external clock signal CL and the chip select signal CE which is input as the input signal IN from the outside is greater than or equal to 2.5 clocks~3 clocks of the internal clock signal ICL, the output signal OUT can be used as the control signal such as the external clock signal CL and the chip select signal CE without any further processing.

(4) The number of input signals of the majority determining circuit can be reduced compared to the related art, to achieve a simplified circuit structure. Because of this, the circuit size of the controlling semiconductor device can be reduced, and the occupation area and manufacturing cost of the semiconductor device can be reduced.

(5) In consideration of a meta-stable state intrinsic to a non-synchronous circuit, that is, a state where the operation of the flip flop becomes unstable when a change occurs in the input signal IN at a timing when a change of rise or fall of the internal clock signal ICL is occurring, no control logic or feedback logic is connected to the flip flop or the latch element of the first stage.

What is claimed is:

1. A noise removal circuit comprising:
   a first holding circuit that holds a first value of an input signal at a first phase of an internal clock signal, wherein the first holding circuit comprises:
      a first flip flop having an input for receiving the input signal, a clock input for receiving a signal representative of the first phase of the internal clock signal, and an output; and
      a second flip flop having an input coupled to the output of the first flip flop, a clock input, and an output for providing the first value of the input signal, wherein the clock input of the second flip flop of the first holding circuit receives a selected one of the internal clock signal and a complement of the internal clock signal;
   a second holding circuit that holds a second value of the input signal at a second phase of the internal clock signal, wherein the second holding circuit comprises:
      a first flip flop having an input for receiving the input signal, a clock input for receiving a signal representative of the second phase of the internal clock signal, and an output; and
      a second flip flop having an input coupled to the output of the first flip flop, a clock input, and an output for providing the second value of the input signal, wherein the clock input of the second flip flop of the second holding circuit receives the selected one of the internal clock signal and the complement of the internal clock signal; and
   a majority circuit coupled to the first holding circuit and the second holding circuit for providing an output signal at a logic state determined by a majority of a plurality of values including the first value and the second value and a prior output of the majority circuit.

2. The noise removal circuit of claim 1, wherein the majority circuit comprises:
   a majority determining circuit for providing the output signal at the logic state determined by the majority of the plurality of values; and
   an output holding circuit having an input coupled to the output of the majority determining circuit, and an output for providing the prior output of the majority circuit.

3. The noise removal circuit of claim 2, wherein the output holding circuit includes a clock input for receiving the internal clock signal.

4. The noise removal circuit of claim 1, wherein the first phase of the internal clock signal is determined by a falling edge thereof, and the second phase of the internal clock signal is determined by a rising edge thereof.

5. The noise removal circuit of claim 1, wherein the signal representative of the first phase of the internal clock signal is the complement of the internal clock signal, and the signal representative of the second phase of the internal clock signal is the internal clock signal.

6. The noise removal circuit of claim 1, wherein the selected one of the internal clock signal and the complement of the internal clock signal comprises the complement of the internal clock signal.

7. A method comprising:
   holding a first value of an input signal at a first phase of an internal clock signal, wherein the holding the first value of the input signal at the first phase of the internal clock signal further comprises storing the first value of the input signal received at a selected edge of the internal clock signal;
   holding a second value of the input signal at a second phase of the internal clock signal, wherein the holding the second value of the input signal at the second phase of the internal clock signal further comprises storing the second value of the input signal received at the selected edge of the internal clock signal;
   determining a majority logic state of a plurality of values including the first value and the second value and a prior value of an output signal; and
   providing the output signal in response to the determining.

8. The method of claim 7 wherein the holding the first value of the input signal at the first phase of the internal clock signal comprises receiving the first value of the input signal at a falling edge of the internal clock signal.

9. The method of claim 8 further wherein the holding the second value of the input signal at the second phase of the internal clock signal comprises receiving the second value of the input signal at a rising edge of the internal clock signal.

10. The method of claim 9 wherein:
    the holding the first value of the input signal at the first phase of the internal clock signal further comprises storing the first value of the input signal received at the falling edge of the internal clock signal; and
    the holding the second value of the input signal at the second phase of the internal clock signal further comprises storing the second value of the input signal received at the falling edge of the internal clock signal.

11. The method of claim 7, wherein the providing the output signal in response to the determining comprises:
    storing the output signal; and
    providing the prior value of the output signal in response to the storing.

* * * * *